(12) United States Patent  
Jeon

(10) Patent No.: US 8,933,344 B2  
(45) Date of Patent: Jan. 13, 2015

(54) DISPLAY APPARATUS

(71) Applicant: Samsung Display Co., Ltd., Yongin (KR)

(72) Inventor: Mu-Kyung Jeon, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 124 days.

(21) Appl. No.: 13/794,729

(22) Filed: Mar. 11, 2013

(65) Prior Publication Data

US 2014/0098495 A1 Apr. 10, 2014

(30) Foreign Application Priority Data

Oct. 8, 2012 (KR) ........................ 10-2012-0111422

(51) Int. Cl.
*H05K 1/16* (2006.01)
*H05K 7/20* (2006.01)

(52) U.S. Cl.
CPC ................................. *H05K 7/20136* (2013.01)
USPC ........................................ 174/260; 361/760

(58) Field of Classification Search
CPC ................................................ H05K 7/20136
USPC ........... 174/260, 261; 361/748, 760, 777–779
See application file for complete search history.

(56) References Cited

U.S. PATENT DOCUMENTS

| | | | |
|---|---|---|---|
| 7,943,934 B2 | 5/2011 | Yoon et al. | |
| 8,330,053 B2 * | 12/2012 | Grespan | 174/260 |
| 2006/0267914 A1 | 11/2006 | Chang et al. | |
| 2008/0053691 A1 * | 3/2008 | Kurihara | 174/260 |
| 2009/0153765 A1 * | 6/2009 | Yamashita et al. | 349/58 |
| 2009/0219457 A1 * | 9/2009 | Seo et al. | 349/55 |
| 2009/0288865 A1 * | 11/2009 | Sagawa et al. | 174/260 |
| 2010/0071946 A1 * | 3/2010 | Hashimoto | 174/260 |

FOREIGN PATENT DOCUMENTS

| | | |
|---|---|---|
| KR | 10-2004-0063521 | 7/2004 |
| KR | 10-2006-0020174 | 3/2006 |
| KR | 10-2006-0124141 | 12/2006 |
| KR | 10-2007-0027376 | 3/2007 |
| KR | 10-2008-0000997 | 1/2008 |
| KR | 10-2008-0044503 | 5/2008 |
| KR | 10-2008-0084201 | 9/2008 |
| KR | 10-2009-0108976 | 10/2009 |

* cited by examiner

*Primary Examiner* — Yuriy Semenenko
(74) *Attorney, Agent, or Firm* — Christie, Parker & Hale, LLP

(57) ABSTRACT

The present invention provides a display substrate for reducing resistance deviation occurring in a fan out unit, and a display apparatus including the display substrate. According to the present invention, resistance units are disposed in lines having a relatively short length in an area where lengths of adjacent lines increase or decrease non-linearly, and the adjacent lines have substantially equal resistance or have linear resistance variation.

22 Claims, 8 Drawing Sheets

DISPLAY APPARATUS

CROSS-REFERENCE TO RELATED PATENT APPLICATION

This application claims priority to the benefit of Korean Patent Application No. 10-2012-0111422, filed on Oct. 8, 2012, in the Korean Intellectual Property Office, the disclosure of which is incorporated herein in its entirety by reference.

BACKGROUND

1. Field

The present invention relates to a display substrate including a pad unit and a fan out unit that are disposed in a non-display area around a display area, on which an image is displayed, and a display apparatus including the display substrate.

2. Description of the Related Art

Portable, thin flat panel display apparatuses are widely used. Examples of flat panel display apparatuses include a light-receiving display apparatus, such as a liquid crystal display apparatus, and a light-emitting display apparatus, such as an organic light-emitting display apparatus and a plasma display apparatus.

The flat panel display apparatus may be partitioned into a display area (on which an image is displayed) and a non-display area around the display area. The display area and the non-display area may be on a substrate. A pad unit and a fan out unit may be disposed in the non-display area. The fan out unit is a portion that connects the pad unit and the display area, in which lines that transmit signals from a driver integrated chip (IC) mounted in the pad unit are provided.

The lines disposed in the fan out unit may have identical lengths. However, if a length of the pad unit is different from a length of an edge portion of the display area, lines disposed at two ends of the pad unit may be longer than those disposed at a center of the pad unit, and the lengths of the lines may linearly increase as they go from the center of the pad unit to the two ends of the pad unit. As the lengths of the lines increase or decrease linearly, and if resistance deviation between adjacent lines is not large, display quality does not degrade so much as to be recognizable by the naked eye.

However, if the pad unit includes a dummy pad that is not connected to a display area so that intervals between the lines are not uniform, and the pad unit is formed towards one side when compared to the display area, lengths of some lines disposed in the fan out unit increase or decrease non-linearly. Accordingly, resistance deviation between adjacent lines increases undesirably, and this resistance deviation causes degradation in display quality, which is recognizable by the naked eye.

SUMMARY

Aspects of the present invention provide a display substrate for reducing a resistance deviation occurring in a fan out unit, and a display apparatus including the display substrate.

According to an aspect of the present invention, there is provided a display apparatus including: a substrate having a display area for displaying an image and a non-display area around a periphery of the display area; a pad unit including: a dummy pad unit that is not connected to a portion of the display area; and a first signal pad unit and a second signal pad unit connected to the portion of the display area, and respectively arranged at sides of the dummy pad unit with the dummy pad unit interposed therebetween, wherein more of the pad unit is on one side of a virtual line that crosses a center of the display area; a first fan out unit connecting the first signal pad unit and the display area, and including a plurality of first lines including resistance units, the first fan out unit being in the non-display area; and a second fan out unit connecting the second signal pad unit and the display area, and including a plurality of second lines that are longer than the first lines, the second fan out unit being in the non-display area. Here, the first lines and the second lines include upper lines and lower lines that do not overlap with each other, have an insulating layer interposed therebetween, and are alternately arranged.

A corresponding one of the resistance units may be between both ends of each of the first lines, which are discontinuous, and the resistance units may each include a resistance member and a connection member that electrically connects the resistance member and the both ends of a corresponding one of the first lines.

The resistance member may include a doped semiconductor material.

The resistance member may include the same material as that of the upper line and may be in the same layer as the upper line.

The resistance member may be in the resistance unit of the upper line from among the first lines.

The resistance member may include the same material as that of the lower line and may be in the same layer as the lower line.

The resistance member may be in the resistance unit of the lower line from among the first lines.

The resistance member may include a transparent conductive oxide.

The connection member may include a low-resistance metal, and may connect the resistance member to the first lines via contact holes.

The first fan out unit and the second fan out unit may have substantially equal resistances or may have resistances that vary linearly from each other.

According to another aspect of the present invention, a display apparatus includes: a substrate having: a display area in which pixels for displaying an image are arranged at locations where a data line and a first gate line, which are on a first insulating layer, cross each other and where the data line and a second gate line, which is insulated from the first gate line by a second insulating layer, cross each other; and a non-display area around a periphery of the display area; a pad unit including: a dummy pad unit that is not connected to a portion of the display area; and a first signal pad unit and a second signal pad unit connected to the portion of the display area, and respectively arranged at sides of the dummy pad unit with the dummy pad unit interposed therebetween, wherein more of the pad unit is on one side of a virtual line that crosses a center of the display area; a first fan out unit connecting the first signal pad unit and the display area, and including a plurality of first lines including resistance units, the first fan out unit being in the non-display area; and a second fan out unit connecting the second signal pad unit and the display area, and including a plurality of second lines that are longer than the first lines, the second fan out unit being in the non-display area. Here, the first lines and the second lines include lower lines in the same layer as the first gate line and upper lines in the same layer as the second gate line, and the first lines and the second lines are non-overlapping, have the second insulating layer interposed therebetween, and are alternately disposed.

A corresponding one of the resistance units may be between both ends of each of the first lines, which are discontinuous, and each of the resistance units may include a resistance member and a connection member that electrically connects both ends of a corresponding one of the first lines.

The resistance member may include a doped semiconductor material, and may be below the first insulating layer.

The resistance member may include the same material as that of the second gate line, and may be in the same layer as the second gate line.

A corresponding one of the resistance members may be in a corresponding one of the upper lines from among the first lines.

The resistance member may include the same material as that of the first gate line and may be in the same layer as the first gate line.

A corresponding one of the resistance members may be in a corresponding one of the resistance units of each of the lower lines of each of the first lines.

The connection member may include a low-resistance metal, and may connect the first lines and the resistance member via contact holes.

The resistance member may include a transparent conductive oxide, and may be on a protection layer formed on the connection member.

The first fan out unit and the second fan out unit may have substantially equal resistance or may have a linear resistance variation as compared to each other.

A driver integrated circuit (IC) for outputting signals may be in the pad unit, and the first lines and the second lines may be configured to transmit signals from the driver integrated circuit (IC) to the display area.

The first lines and the second lines may be configured to transmit the signals from the driver integrated circuit (IC) to the data line.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
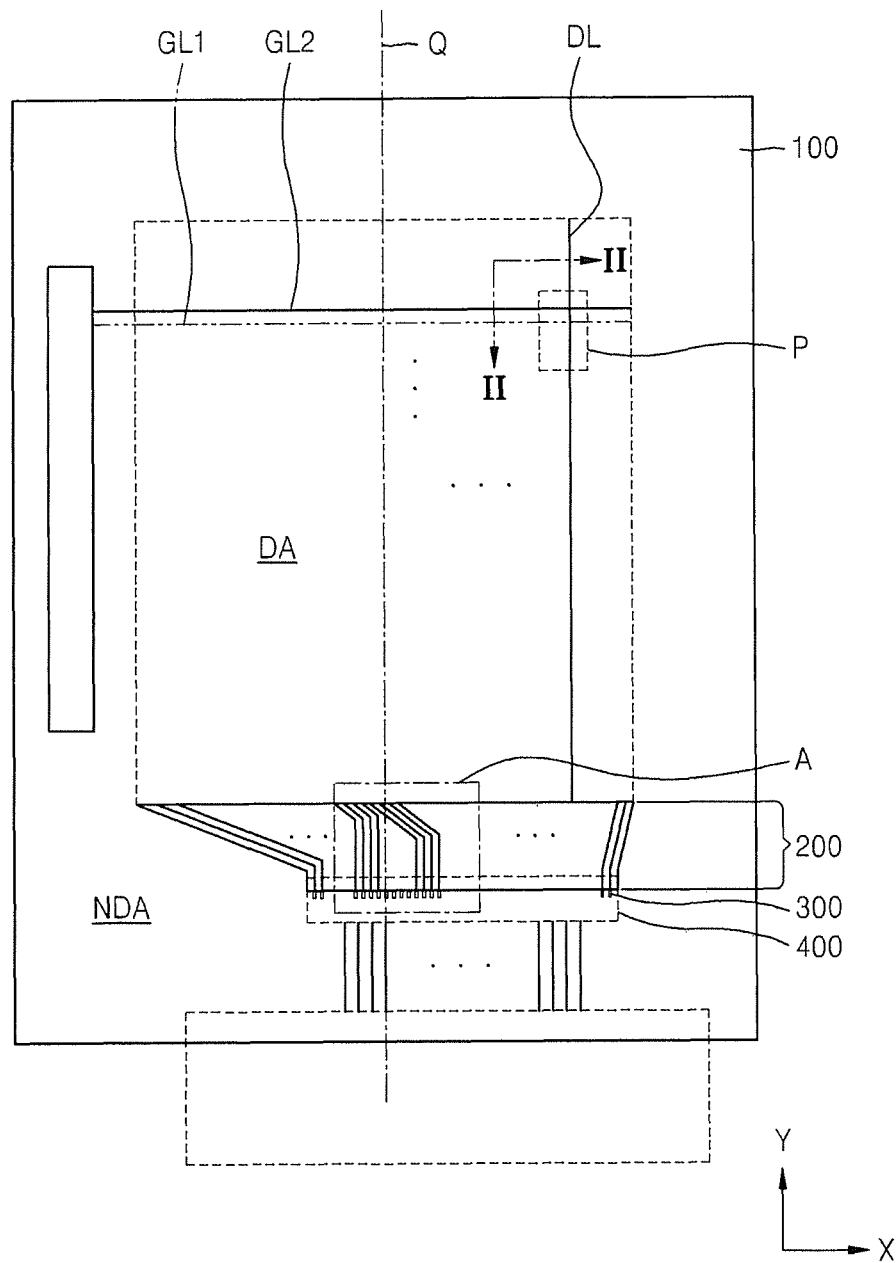
FIG. 1 is a schematic view of a display substrate of a display apparatus according to an embodiment of the present invention.

The present invention will now be described more fully with reference to the accompanying drawings, in which exemplary embodiments of the present invention are shown such that one of ordinary skill in the art may easily understand the present invention. This invention may, however, be embodied in many different forms and should not be construed as limited to the embodiments set forth herein.

For clarity of the description of the present invention, some elements not required for understanding the present invention may be omitted. Throughout the present specification, like elements are indicated by like reference numerals.

Also, sizes and thicknesses of components illustrated in the drawings are provided for convenience of description, and are not limited as illustrated in the drawings. For example, in the drawings, the thicknesses of layers and areas may be exaggerated for clarity of description.

It will be understood that when a layer is referred to as being "on" another layer, film, area or substrate, it can be directly on the other layer, film, area or substrate, or one or more intervening layers may also be present.

Throughout the present specification, it is to be understood that the terms such as "including" or "having," etc., are intended to indicate the existence of the components thereof disclosed in the specification, and are not intended to preclude the possibility that one or more other components may exist or may be added. In addition, throughout the specification, it is to be understood that the term "on" denotes on top of or under an object, and does not necessarily indicate that an object contacts another object with respect to a gravitational direction.

A display substrate 100 according to an embodiment of the present invention and a display apparatus including the display substrate 100 will be described below in more detail with reference to the accompanying drawings. While an organic light emitting display apparatus is described as the display apparatus according to the current embodiment of the present invention, the embodiments of the present invention are not limited thereto.

Figure 2:
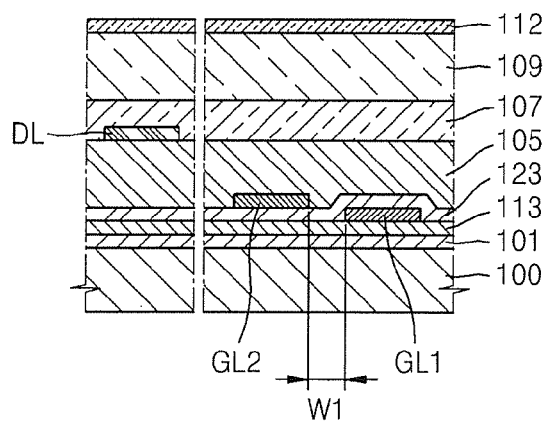
FIG. 2 is a schematic cross-sectional view of the display substrate of FIG. 1 cut along the line II-II according to an embodiment of the present invention.
Figure 3:
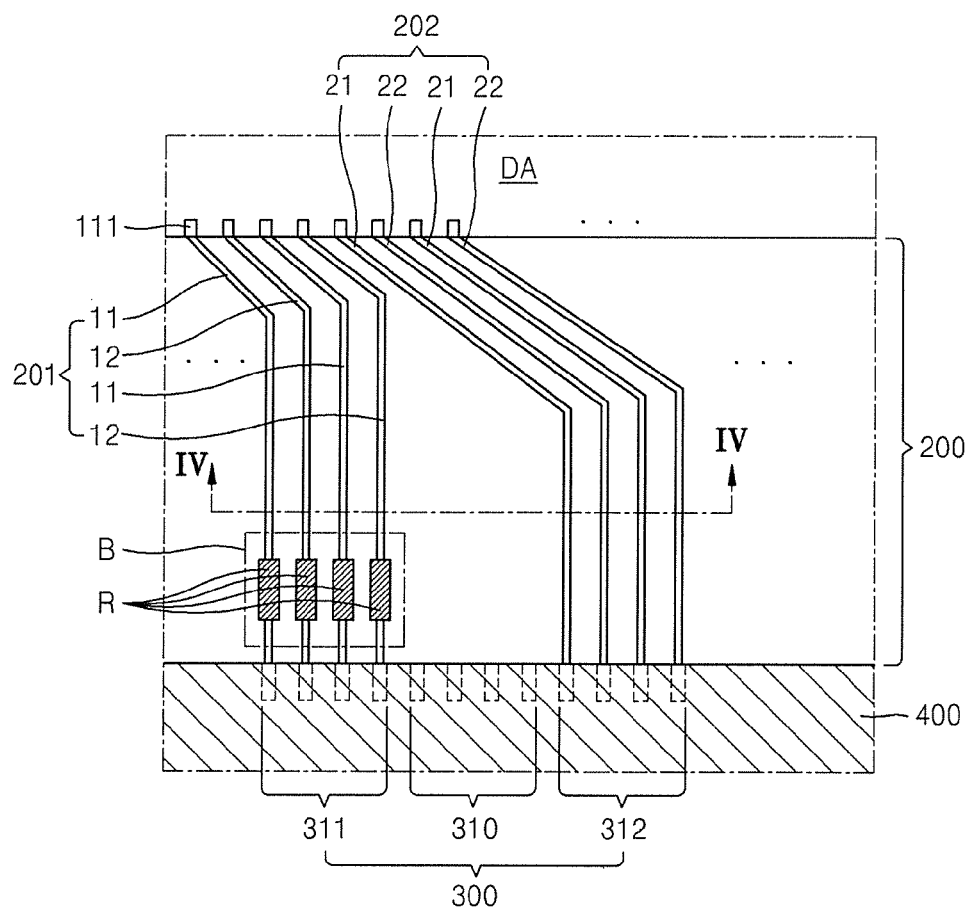
FIG. 3 is an extended schematic view of a portion A of the display substrate of FIG. 1 according to an embodiment of the present invention.
Figure 4:
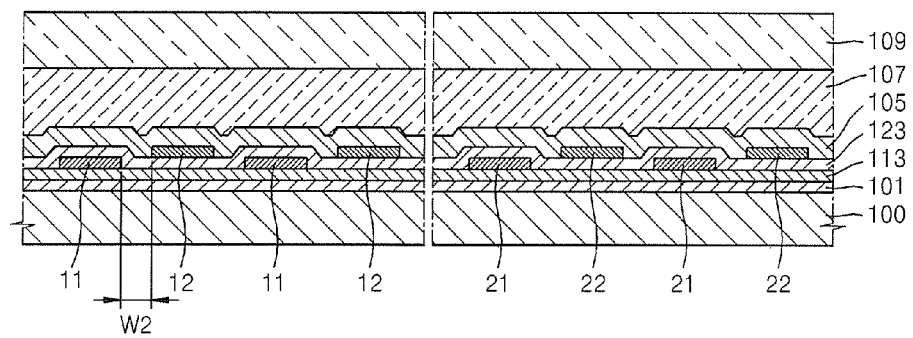
FIG. 4 is a schematic cross-sectional view of FIG. 3 cut along the line IV-IV according to an embodiment of the present invention.

FIG. 1 is a schematic view of a display substrate 100 according to an embodiment of the present invention. FIG. 2 is a schematic cross-sectional view of the display substrate 100 of FIG. 1 cut along the line II-II according to an embodiment of the present invention. FIG. 3 is an extended schematic view of a portion A of the display substrate 100 of FIG. 1 according to an embodiment of the present invention. FIG. 4 is a schematic cross-sectional view of FIG. 3 cut along the line IV-IV according to an embodiment of the present invention.

Referring to FIG. 1, the display apparatus includes a display substrate 100 and an encapsulation substrate (not shown). The display substrate 100 is divided into a display area DA at which an image is formed and a non-display area NDA around the display area DA (e.g., around a periphery of the display area). Although not shown in FIG. 1, an encapsulation member may be disposed in the non-display area NDA to surround the display area DA in order to bond an encapsulation substrate that encapsulates the display area DA from external air. If the encapsulation substrate is a thin film type encapsulation substrate, the encapsulation member may be omitted. The encapsulation substrate may be disposed to face the display substrate 100 with the encapsulation member therebetween. The display substrate 100 according to an embodiment of the present invention will now be described in detail.

Referring to FIGS. 1 and 2, the display area DA is where an image is displayed and where various signal lines and pixels P connected to the various signal lines are located (or disposed). Examples of the signal lines include first gate lines GL1 extending in a first direction X and second gate lines GL2 and data lines DL extending in a second direction Y, and the pixels P may be in areas where the first gate lines GL1 and the second gate lines GL2 cross the data lines DL.

The first gate lines GL1 may be on a first insulating layer 113 and may extend in the first direction X. The first gate lines GL1 may include a previous scan line and a light-emitting control line, but are not limited thereto. The first gate lines GL1 may be connected to a gate driving unit or a light-emitting control driving unit and may receive a scan signal or a light-emitting control signal, but are not limited thereto.

The second gate lines GL2 may be insulated from the first gate lines GL1 by a second insulating layer 123 interposed therebetween, and may extend in the first direction X. The second gate lines GL2 may include a scan line and an initialization power line, but are not limited thereto. The second gate lines GL2 may be connected to a gate driving unit or an initialization power driving unit to receive a scan signal or an initialization power, but are not limited thereto.

The first gate lines GL1 and the second gate lines GL2 may be non-overlapping. That is, the first gate lines GL1 and the second gate lines GL2 may not be overlapped with one another. As described above, in the display substrate 100 according to an embodiment of the present invention, as the first gate lines GL1 and the second gate lines GL2 are respectively located (e.g., disposed) in different layers with the second insulating layer 123 therebetween, a distance W1 between adjacent gate lines GL1, GL2 (which are located (e.g., disposed) in different layers) may be narrow, and thus, more pixels P may be formed in the same area. In other words, a high resolution display apparatus may be formed.

Types of signal lines formed by the first gate lines GL1 and the second gate lines GL2, types of signals which are transmitted through the signal lines, and the type and the number of driving units to which the signal lines are connected, are not limited to those described above or to those illustrated in the drawings, but may be modified or varied in various manners (as a person of ordinary skill in the art would recognize).

The data lines DL may be insulated from the first and second gate lines GL1 and GL2 by the third insulating layer 105 interposed therebetween, and may extend in the second direction Y that crosses the first direction X. The data lines DL may be connected to a driver IC 400 (mounted in the pad unit 300) via lines of the fan out unit 200. The data lines DL may receive a data signal from the driver IC 400 via the lines of the fan out unit 200.

A plurality of pixels P is respectively disposed in areas where the gate lines GL1 and the second gate lines GL2 cross the data lines DL. According to an embodiment of the present invention, each pixel P includes an organic light emitting device emitting light of a luminance corresponding to a driving current, which corresponds to a data signal, and a pixel circuit for controlling the driving current flowing through the organic light emitting device. Pixel circuits are respectively connected to the first gate lines GL1, the second gate lines GL2, and the data lines DL, and the organic light emitting device is connected to the pixel circuit. The pixel circuits may include electronic devices such as a plurality of thin film transistors and a plurality of capacitors.

The organic light emitting device may be connected to a first power source ELVDD. The pixel circuit is interposed between the organic light emitting device and first power source ELVDD, and the organic light emitting device is connected to a second power source ELVSS. The pixels P emit light of a luminance corresponding to a driving current flowing through the organic light emitting device from the first power source ELVDD to the second power source ELVSS.

Referring to FIG. 2, a reference numeral 107 denotes a protection layer or a planarization layer and a reference numeral 109 denotes a pixel definition layer. In addition, a reference numeral 112 denotes an opposite electrode.

Referring to FIGS. 1 and 3, the non-display area NDA does not display an image, and is an area where various elements for driving the display area DA and other elements are mounted. In the non-display area NDA, a driver IC 400, a pad unit 300 and a fan out unit 200 (connecting the driver IC 400 and the display area DA) may be formed.

The driver IC 400 may be a chip on glass (COG) type, and may be mounted on the display substrate 100. A connection terminal (not shown) that is electrically connected to the pad unit 300 formed on the display substrate 100 may be disposed at one side of the driver IC 400. The driver IC 400 may include a data driving unit for supplying a data signal and other various functional units for driving the display area DA.

According to an embodiment of the present invention, the pad unit 300 is on (e.g., formed on) the display substrate 100 and is a portion to which the connection terminal of the driver IC 400 is electrically connected. Here, the pad unit 300 is extended from lines disposed in the fan out unit 200. The pad unit 300 may be connected to the display area DA via the lines in the fan out unit 200. The pad unit 300 according to an embodiment of the present invention includes a dummy pad unit 310 and first and second signal pad units 311 and 312.

The dummy pad unit 310 refers to an inactive channel that is not connected to the display area DA. The dummy pad unit 310 may be formed if the number of connection terminals of the driver IC 400 is more than the number appropriate (or suitable) for a resolution of a display apparatus, but is not limited thereto and may be included according to other design considerations. The dummy pad unit 310 may be arranged (or disposed) in a center of the pad unit 300, but is not limited thereto.

The first and second signal pad units 311 and 312, according to an embodiment of the present invention, refer to channels that are connected to the display area DA and through which data signals are transmitted from the driver IC 400 to the lines arranged in the fan out unit 200. According to an embodiment of the present invention, the first signal pad unit 311 and the second signal pad unit 312 are respectively located (or disposed) on first and second sides of the dummy pad unit 310, with the dummy pad unit 310 located therebetween. Here, the first and second sides of the dummy pad unit 310 are relative with respect to each other, and are not limited to the illustrated directions.

According to an embodiment of the present invention, the driver IC 400 is located (or disposed) such that a virtual line Q across a center of the display area DA does not correspond to a center of the driver IC 400. That is, the driver IC 400 is arranged (or formed) toward one side of the display substrate 100 such that the virtual line Q that crosses the center of the display area DA corresponds to a side portion of the driver IC 400 (e.g., it is offset). Accordingly, more of the pad unit 300 (which is connected to the driver IC 400) is at one side of the virtual line Q (which crosses the center of the display area DA). If the driver IC 400 is in the center of the non-display area NDA, space for installing additional elements on the display substrate 100 is narrowed. Accordingly, by forming the driver IC 400 towards one side of the non-display area NDA, space for installing other elements may be provided.

Because the driver IC 400 and the pad unit 300 are formed toward one side of the non-display area NDA, lengths of the lines arranged (or disposed) in the pad unit 300 and the non-display area DA are varied. Here, the fan out unit 200 refers to a portion where a bundle of lines for connecting signal input ends 111 and the pad unit 300 are located (or disposed).

The fan out unit 200, according to an embodiment of the present invention, is where lines connecting the first and second signal pad units 311 and 312 and the display area DA are disposed. The fan out unit 200 may include a first fan out unit 201 and a second fan out unit 202. The first fan out unit 201 may include first lines 11 and 12 for connecting the first signal pad unit 311 to the display area DA. The second fan out unit 202 may include second lines 21 and 22 for connecting the second signal pad unit 312 to the display area DA.

Referring to FIG. 4, the first lines 11 and 12 and the second lines 21 and 22 respectively include upper lines 12 and 22 and lower lines 11 and 21, which are disposed in different layers. In detail, the upper lines 12 and 22 and the lower lines 11 and 21 do not overlap with one another, have the second insulating layer 123 located therebetween, and are alternately arranged. The lower lines 11 and 21 may be formed of the same material and in the same layer as the first gate lines GL1 of the display area DA described above. The upper lines 12 and 22 may be formed of the same material and in the same layers as the second gate lines GL2 of the display area DA described above. As described above, the first lines 11 and 12 and the second lines 21 and 22 are divided into the upper lines 12 and 22 and the lower lines 11 and 21 so as to be located in different layers with the second insulating layer 123 located therebetween, thereby narrowing a distance W2 between adjacent lines included in different layers. Accordingly, more lines may be formed in the same surface area, thereby forming a high resolution display apparatus.

Referring back to FIG. 3, here, unlike the second fan out unit 202, the first fan out unit 201 includes an additional resistance structure. In detail, resistor units R may be included in the first lines 11 and 12. The resistor units R included in the first lines 11 and 12 will be described in detail with reference to FIGS. 6 through 14 below.

According to an embodiment of the present invention, the driver IC 400 and the pad unit 300 are located (or formed) toward one side of the non-display area NDA, and, as the dummy pad unit 310 is located (or formed) in the pad unit 300, there are portions where lengths of lines non-linearly increase or decrease (e.g., as compared with other lines). That is, when compared to the first lines 11 and 12, lengths of the second lines 21 and 22 vary non-linearly. As the pad unit 300 is located more to one side, the second lines 21 and 22 are bent in correspondence to the location of the pad unit 300, and as the dummy pad unit 310 is included, intervals between the lines which are arranged at equal intervals are widened by the dummy pad unit 310 located therebetween. Accordingly, the lengths of the second lines 21 and 22 near the dummy pad unit 310 increase.

Resistance of a line is determined according to Equation 1 below. Here, S denotes a cross-sectional area of the line, ρ denotes specific resistance of a line material, and L denotes a line length.

$$R = \rho \frac{L}{S}$$ [Equation 1]

The first lines 11 and 12 include an upper line 12 and a lower line 11 and the second lines 21 and 22 include an upper line 22 and a lower line 21. Line resistance of the first lines 11 and 12 and the second lines 21 and 22 vary according to line lengths. As a result, line lengths of the second lines 21 and 22 near the dummy pad unit 310 increase as compared to the first lines 11 and 12, and thus, a difference in line resistance is great. If the difference in resistance between the first lines 11 and 12 and the second lines 21 and 22 is large, a difference in time when a signal is input via the driver IC 400 to the display area DA is also great. Due to this difference in time, the pixels P receiving data signals from the second lines 21 and 22 have a time delay. This time delay results in a difference in phase, and when an image is displayed, stripes are generated due to the difference in phase, thereby degrading display quality.

However, according to an embodiment of the present invention, as the resistor units R are included in the first lines 11 and 12 (which are short in length), a resistance variation between the first lines 11 and 12 and the second lines 21 and 22 may be reduced. That is, due to the resistor units R, the first lines 11 and 12 and the second lines 21 and 22 have a linear resistance variation or a substantially equal resistance. Accordingly, display defects caused due to the resistance deviation of the fan out unit 200 may be prevented.

Referring back to FIG. 3 again, the first lines 11 and 12 located in the first fan out unit 201 include the same resistor units R, respectively. Accordingly, this satisfies a condition in which line resistance of the first fan out unit 201 varies linearly. This is because a line length linearly increases from a center of the pad unit 300 to an end of the pad unit, and line resistance also increases linearly according to the linearly increasing line length. Thus, if resistance of the resistor units R disposed in the first lines 11 and 12 are all uniform from the center of the pad unit 300 to an end thereof, line resistance linearly increases from the center to the end of the pad unit 300. In this case, resistance deviation of all of the first fan out unit 201 and the second fan out unit 202 may be uniform within a suitable (or predetermined) range. When the line resistance of the fan out unit 200 satisfies the linearly increasing condition, signal delay due to a difference in line resistance may be prevented, thereby eliminating display defects.

Figure 5:
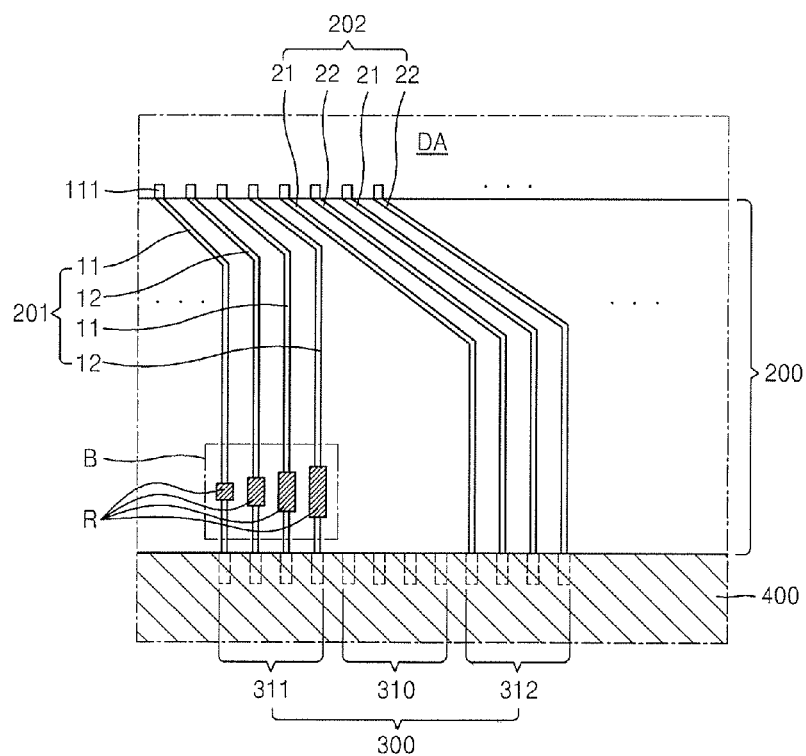
FIG. 5 is an enlarged schematic view of the portion A of the display substrate of FIG. 1 according to another embodiment of the present invention.

FIG. 5 is an enlarged schematic view of the portion A of the display substrate 100 of FIG. 1 according to another embodiment of the present invention.

Referring to FIG. 5, the first lines 11 and 12 located in the first fan out unit 201 include resistance units R that vary (e.g. vary linearly). For example, resistance of the resistance units R disposed in the first lines 11 and 12 may become smaller from a center toward an end of the pad unit 300. Accordingly, this allows for the line resistance of the first fan out unit 201 to be substantially equal. That is, as lengths of the lines linearly increase from the center to the end of the pad unit 300, the line resistances linearly increase accordingly. Thus, when the resistance of the line units R located in the first lines 11 and 12 decreases from the center to the end of the pad unit 300, line resistance from the center to the end of the pad unit 300 is uniform. If the resistances of the lines of the fan out unit 200 are equal, signal delay caused due to a difference in line resistance and display defects may be prevented.

Figure 6:
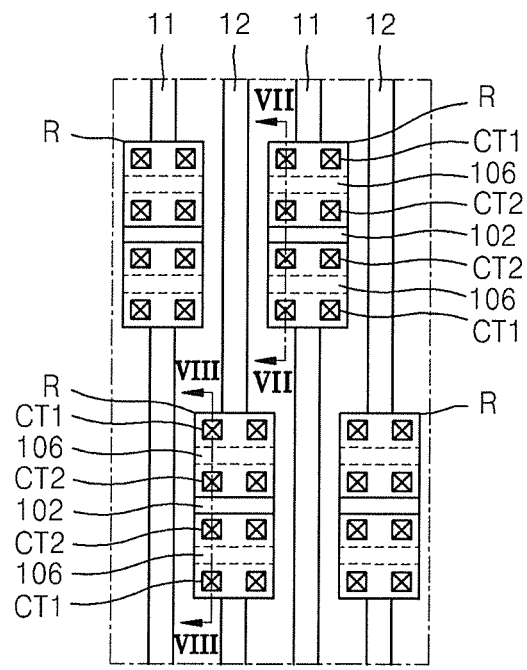
FIGS. 6 through 8 are schematic cross-sectional views illustrating resistance units of first lines of FIG. 3 according to an embodiment of the present invention.
Figure 7:
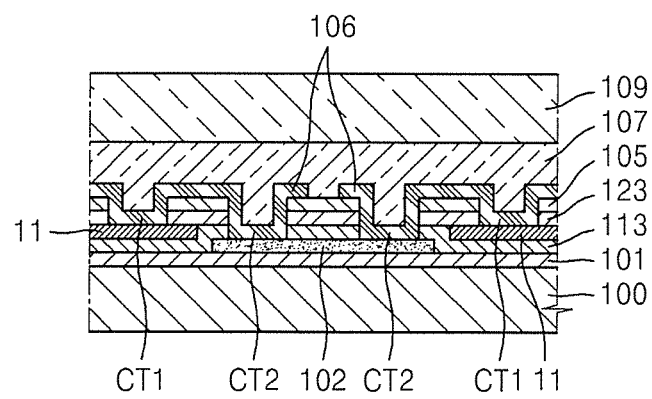
Figure 8:
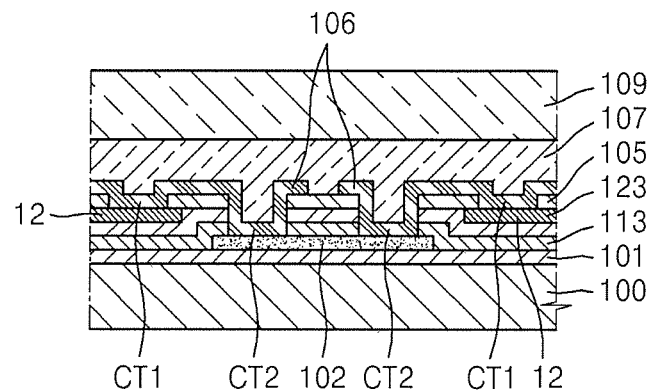

FIGS. 6 through 8 are schematic cross-sectional views illustrating the resistance units R of first lines 11 and 12 of FIG. 3 according to an embodiment of the present invention. FIG. 6 is an enlarged schematic view of a portion B of FIG. 3. FIG. 7 is a cross-sectional view of the resistance unit R of FIG. 6 cut along a line VII-VII. FIG. 8 is a cross-sectional view of the resistance unit R of FIG. 6 cut along a line VIII-VIII.

Referring to FIG. 6, the resistance units R, which are included both in the upper lines 12 and the lower lines 11 of the first lines 11 and 12 are interposed between both ends of the first lines 11 and 12, which may be discontinuous as a portion thereof may be cut. The resistance unit R may include a connection member 106 that electrically connects both ends of the first lines 11 and 12 that may be discontinuous to the first resistance member 102.

The first resistance member 102 may be located (or disposed) below the first insulating layer 113, and may include a doped semiconductor material. Here, a semiconductor material may be a polycrystalline silicon or an amorphous silicon, and may be doped with N or P type impurities. However, the semiconductor material is not limited thereto, and may be an oxide semiconductor including at least one material that is selected from the group consisting of indium (In), gallium (Ga), tin (Sn), zirconium (Zr), vanadium (V), hafnium (Hf), cadmium (Cd), germanium (Ge), and zinc (Zn).

The connection member 106 may be formed on the third insulating layer 105 and may electrically connect both ends of the first lines 11 and 12 and the first resistance member 102 via first and second contact holes CT1 and CT2. The connection member 106 may be formed as a single layer or a multi-layer using at least one low-resistance metal selected from the group consisting of aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and copper (Cu).

FIG. 7 is a schematic cross-sectional view of the lower line 11 from among the first lines 11 and 12.

The lower lines 11 may be formed on the first insulating layer 113, and may include a discontinuous section corresponding to the resistance unit R. The first resistance member 102 including a doped semiconductor material may be formed on a buffer layer 101 in the section of the resistance unit R. The first insulating layer 113 may be formed on the first resistance member 102. The second insulating layer 123 and the third insulating layer 105 may be formed to cover the first insulating layer 113 and the lower lines 11. The first contact holes CT1 may be formed in portions of the second insulating layer 123 and the third insulating layer 105 corresponding to both ends of the lower line 11, respectively. The second contact holes CT2 may be formed in portions of the first insulating layer 113, the second insulating layer 123, and the third insulating layer 105 corresponding to both ends of the first resistance member 102, respectively. The connection members 106 that electrically connect the lower lines 11 and the first resistance member 102 via the first contact hole CT1 and the second contact hole CT2 may be formed on the third insulating layer 105.

FIG. 8 is a schematic cross-sectional view of the upper line 12 from among the first lines 11 and 12 of FIG. 6.

The upper line 12 may be formed on the second insulating layer 123, and may include a discontinuous section corresponding to the resistance unit R. The first resistance member 102 including a doped semiconductor material may be formed below the first insulating layer 113 in the section of the resistance unit R. The first insulating layer 113 and the second insulating layer 123 may be formed on the first resistance member 102. The third insulating layer 105 may be formed to cover the second insulating layer 123 and the upper lines 12. The first contact hole CT1 may be formed in a portion of the third insulating layer 105 corresponding to both ends of the upper lines 12. The second contact holes CT2 may be formed in portions of the first insulating layer 113, the second insulating layer 123, and the third insulating layer 105 corresponding to both ends of the first resistance member 102. The connection member 106 that electrically connects the upper line 12 and the first resistance member 102 via the first contact hole CT1 and the second contact hole CT2 may be formed on the third insulating layer 105.

According to an embodiment of the present invention, resistance of the resistance unit R may vary according to a length, specific resistance, and a cross-section of a resistance member according to Equation 1.

$$R = \rho \frac{L}{S} \qquad \text{[Equation 1]}$$

For example, the longer the length of the resistance member, the higher the resistance thereof, and when the cross-section of the resistance increases, the resistance decreases. Also, resistance may vary according to a specific resistance of the resistance member. Accordingly, the resistance of the resistance unit may vary by adjusting a cross-section or a length of the resistance member or may be adjusted by varying a doping density.

Figure 9:
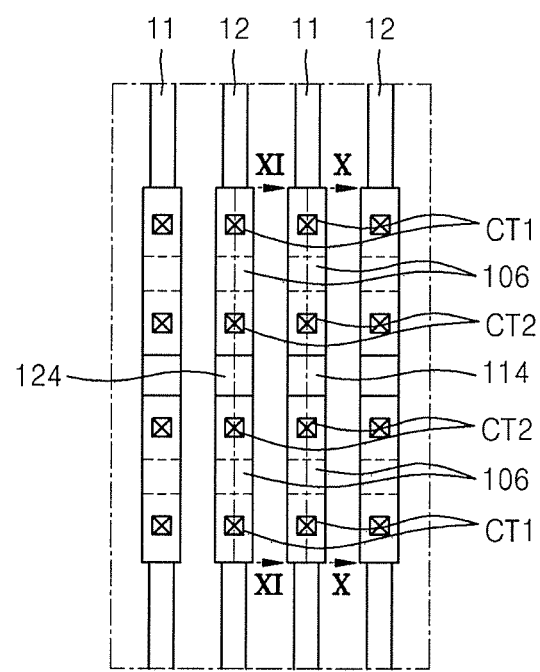
FIGS. 9 through 11 are schematic cross-sectional views illustrating resistance units of first lines of FIG. 3 according to another embodiment of the present invention.
Figure 10:
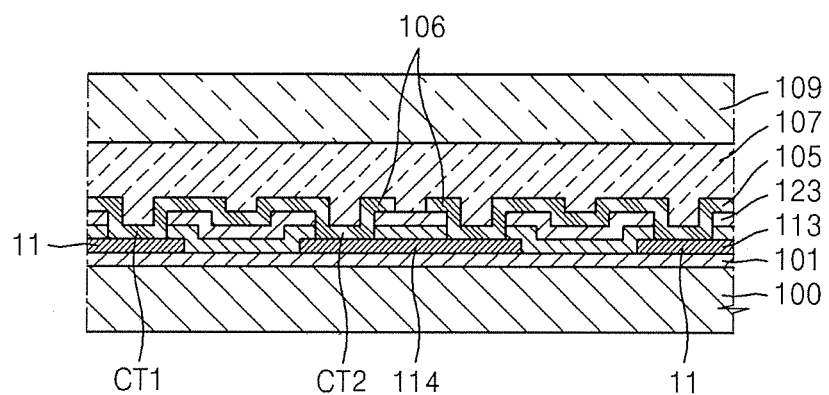
Figure 11:
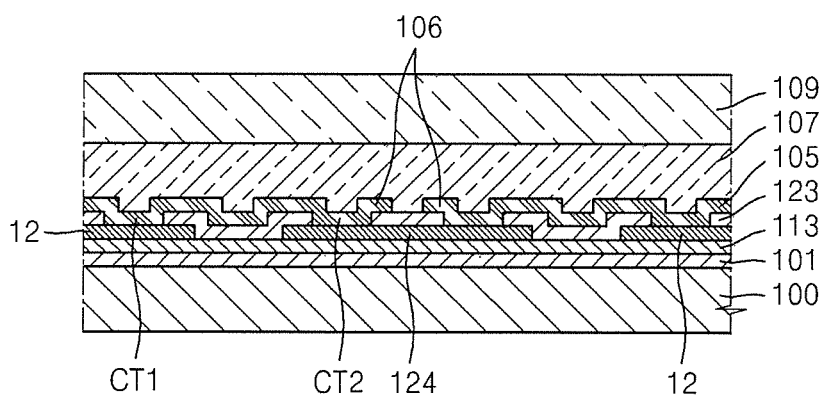

FIGS. 9 through 11 are schematic cross-sectional views illustrating the resistance units R of the first lines 11 and 12 of FIG. 3 according to embodiments of the present invention. FIG. 9 is an enlarged schematic view of the portion B of FIG. 3 according to an embodiment of the present invention. FIG. 10 is a schematic cross-sectional view of the resistance units of FIG. 9 cut along a line X-X, and FIG. 11 is a schematic cross-sectional view of the resistance units of FIG. 9 cut along a line XI-XI.

The resistance units R illustrated in FIGS. 9 through 11 are different from the resistance units R of FIGS. 6 through 8 in that a second resistance member 114 and a third resistance member 124 are formed in the same layer and of the same material as those of the upper lines 12 or the lower lines 11. The same reference numerals of FIGS. 9 through 11 as those of FIGS. 6 through 8 denote like elements. Like elements have like functions or operations, and thus, description thereof will be given by way of reference to the above-described embodiments.

FIG. 10 is a schematic cross-sectional view of the lower lines 11 from among the first lines 11 and 12 of FIG. 9.

The lower line 11 may be formed on the first insulating layer 113, and may have a discontinuous section corresponding to the resistance unit R. In the section of the resistance unit R, the second resistance member 114 may be formed in the same layer and formed of the same material as the lower line 11. The second insulating layer 123 and the third insulating layer 105 may be formed on the second resistance member 114 and the lower line 11. The first contact holes CT1 may be respectively located in portions of the second insulating layer 123 and the third insulating layer 105 corresponding to both ends of the lower line 11. The second contact holes CT2 may be respectively located in portions of the first insulating layer 113, the second insulating layer 123, and the third insulating layer 105 corresponding to both ends of the second resistance member 114. The connection member 106 that electrically connects the lower line 11 and the second resistance member 114 via the first contact holes CT1 and the second contact holes CT2 may be on the third insulating layer 105. The lower line 11 and the second resistance member 114, according to an embodiment of the present invention, are formed in the same layer and of the same material as those of the first gate lines GL1 (see FIG. 2).

FIG. 11 is a schematic cross-sectional view of the upper line 12 from among the first lines 11 and 12 of FIG. 9.

The upper line 12 may be on the second insulating layer 123, and may include a discontinuous section corresponding to the resistance unit R. The third resistance member 124 may be in the same layer and of the same material as those of the upper lines 12, and may be in the section of the resistance unit R. The third insulating layer 105 may be on the third resistance member 124 and the upper line 12. The first contact holes CT1 may be in a portion of the third insulating layer 105 corresponding to both ends of the upper lines 12. The second contact holes CT2 may be in portions of the third insulating layer 105 corresponding to both ends of the third resistance member 124. The connection member 106 that electrically connects the upper line 12 and third resistance member 124 via the first contact holeCT1 and the second contact holeCT2 may be on the third insulating layer 105. The upper line 12 and the third resistance member 124, according to an embodiment of the present invention, are in the same layer and of the same material as those of the second gate lines GL2 (see FIG. 2).

Figure 12:
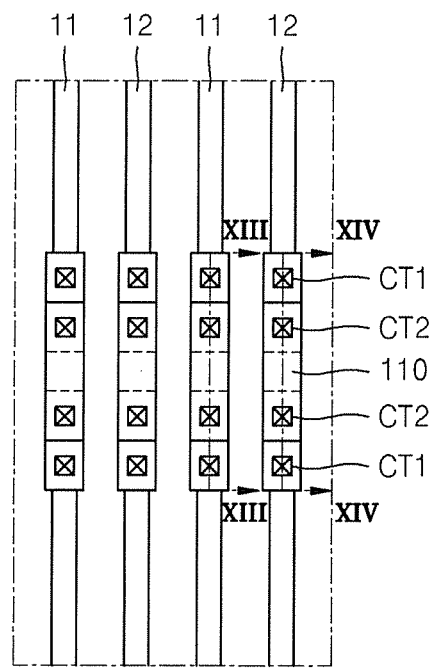
FIGS. 12 through 14 are schematic cross-sectional views illustrating resistance units of first lines of FIG. 3 according to another embodiment of the present invention.
Figure 13:
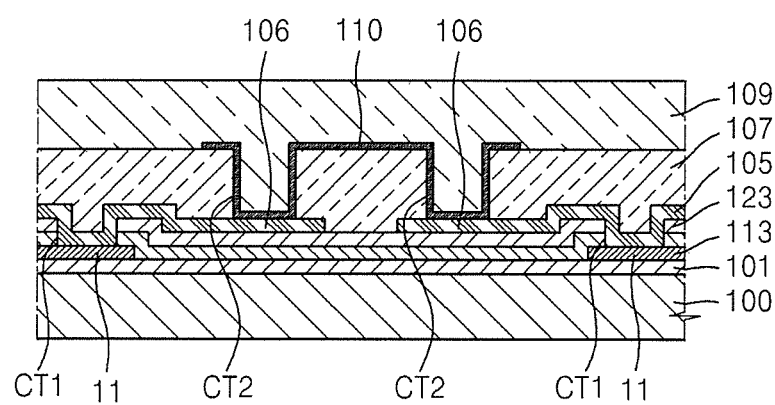
Figure 14:
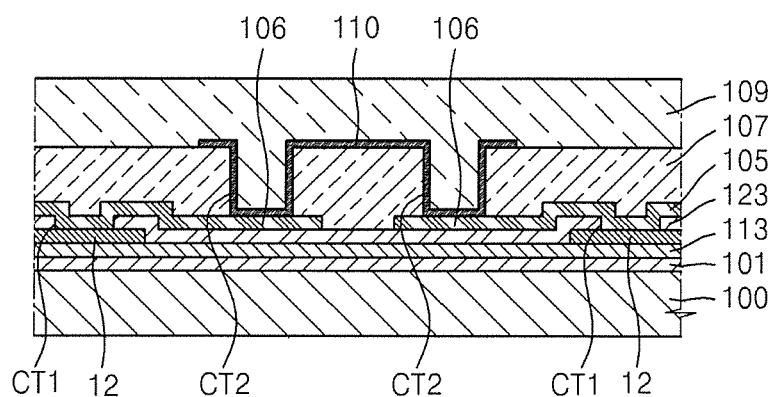

FIGS. 12 through 14 are schematic cross-sectional views illustrating the resistance units R of the first lines 11 and 12 of FIG. 3 according to an embodiment of the present invention. FIG. 12 is an enlarged schematic view of the portion B of FIG. 3 according to an embodiment of the present invention. FIG. 13 is a schematic cross-sectional view of the resistance units of FIG. 12 cut along a line XIII-XIII, and FIG. 14 is a schematic cross-sectional view of the resistance units of FIG. 12 cut along a line XIV-XIV.

The resistance units R according to the current embodiment of the present invention illustrated in FIGS. 12 through 14 are different from the resistance units R according to the previous embodiments in that a fourth resistance member 110 is a transparent conductive oxide formed on the protection layer 107. The same reference numerals of FIGS. 12 through 14 as those of FIGS. 6 through 11 denote like elements. Like elements have like functions or operations, and thus description thereof will be given by way of reference to the above-described embodiments.

The fourth resistance member 110 may be located (or disposed) on the protection layer 107 on the connection member 106, and may include a transparent conductive oxide. The transparent conductive oxide may include at least one selected from the group consisting of indium tin oxide (ITO), indium zinc oxide (IZO), zinc oxide (ZnO), indium oxide (In$_2$O$_3$), indium gallium oxide (IGO), and aluminum zinc oxide (AZO).

FIG. 13 is a schematic cross-sectional view of the lower line 11 from among the first lines 11 and 12 of FIG. 12.

The lower line 11 may be on the first insulating layer 113, and may include a discontinuous section corresponding to the resistance unit R. In the section of the resistance unit R, the fourth resistance member 110 that is on the second insulating layer 123, the third insulating layer 105, and the protection layer 107 may be on the lower line 11 and may include a transparent conductive oxide. The fourth resistance member 110 may be electrically connected to the connection member 106 located between the protection layer 107 and the third insulating layer 105 via the second contact holes CT2 located in the protection layer 107. Here, the connection member 106 is electrically connected to the lower line 11 via the first contact holes CT1 in portions of the second insulating layer 123 and the third insulating layer 105 corresponding to both ends of the lower line 11.

FIG. 14 is a schematic cross-sectional view illustrating the upper line 12 from among the first lines 11 and 12 of FIG. 12.

The upper line 12 may be formed on the second insulating layer 123 and may include a discontinuous section corresponding to the resistance unit R. In the section of the resistance unit R, the fourth resistance member 110 (which may be on the third insulating layer 105 and the protection layer 107 on the upper line 12, and may include a transparent conductive oxide) is located. The fourth resistance member 110 may be electrically connected to the connection member 106 located between the protection layer 107 and the third insulating layer 105 via the second contact holes CT2 in the protection layer 107. The connection member 106 may be electrically connected to the lower line 11 via the first contact holes CT1 in portions of the third insulating layer 105 corresponding to both ends of the upper lines 12.

According to one or more embodiments of the present invention, resistance units are in lines having a relatively short length in an area where lengths of adjacent lines increase or decrease non-linearly. Accordingly, the adjacent lines have substantially equal resistance or have a linear resistance variation. Accordingly, display defects caused by a deviation in resistance of a fan out unit may be prevented.

While the present invention has been particularly shown and described with reference to exemplary embodiments thereof, it will be understood by those of ordinary skill in the art that various changes in form and details may be made without departing from the spirit and scope of the present invention as defined by the following claims and their equivalents.

What is claimed is:

1. A display apparatus comprising:
   a substrate having a display area for displaying an image and a non-display area around a periphery of the display area;
   a pad unit comprising:
      a dummy pad unit that is not connected to a portion of the display area;
      and a first signal pad unit and a second signal pad unit connected to the portion of the display area, and respectively arranged at sides of the dummy pad unit with the dummy pad unit interposed therebetween, wherein more of the pad unit is on one side of a virtual line that crosses a center of the display area;
   a first fan out unit connecting the first signal pad unit and the display area, and comprising a plurality of first lines comprising resistance units, the first fan out unit being in the non-display area; and
   a second fan out unit connecting the second signal pad unit and the display area, and comprising a plurality of second lines that are longer than the first lines, the second fan out unit being in the non-display area,
   wherein the first lines and the second lines comprise upper lines and lower lines that do not overlap with each other, have an insulating layer interposed therebetween, and are alternately arranged.

2. The display apparatus of claim 1, wherein a corresponding one of the resistance units are between both ends of each of the first lines, which are discontinuous, and
   wherein the resistance units each comprise a resistance member and a connection member that electrically connects the resistance member and the both ends of a corresponding one of the first lines.

3. The display apparatus of claim 2, wherein the resistance member comprises a doped semiconductor material.

4. The display apparatus of claim 2, wherein the resistance member comprises the same material as that of the upper line and is in the same layer as the upper line.

5. The display apparatus of claim 4, wherein the resistance member is in the resistance unit of the upper line from among the first lines.

6. The display apparatus of claim 2, wherein the resistance member comprises the same material as that of the lower line and is in the same layer as the lower line.

7. The display apparatus of claim 6, wherein the resistance member is in the resistance unit of the lower line from among the first lines.

8. The display apparatus of claim 2, wherein the resistance member comprises a transparent conductive oxide.

9. The display apparatus of claim 2, wherein the connection member comprises a low-resistance metal, and connects the resistance member to the first lines via contact holes.

10. The display apparatus of claim 1, wherein the first fan out unit and the second fan out unit have substantially equal resistances or have resistances that vary linearly from each other.

11. A display apparatus comprising:
   a substrate having:
      a display area in which pixels for displaying an image are arranged at locations where a data line and a first gate line, which are on a first insulating layer, cross each other and where the data line and a second gate line, which is insulated from the first gate line by a second insulating layer, cross each other; and
      a non-display area around a periphery of the display area;
   a pad unit comprising:
      a dummy pad unit that is not connected to a portion of the display area; and
      a first signal pad unit and a second signal pad unit connected to the portion of the display area, and respectively arranged at sides of the dummy pad unit with the dummy pad unit interposed therebetween,
      wherein more of the pad unit is on one side of a virtual line that crosses a center of the display area;
   a first fan out unit connecting the first signal pad unit and the display area, and comprising a plurality of first lines comprising resistance units, the first fan out unit being in the non-display area; and
   a second fan out unit connecting the second signal pad unit and the display area, and comprising a plurality of second lines that are longer than the first lines, the second fan out unit being in the non-display area,
   wherein the first lines and the second lines comprise lower lines in the same layer as the first gate line and upper lines in the same layer as the second gate line, and
   wherein the first lines and the second lines are non-overlapping, have the second insulating layer interposed therebetween, and are alternately disposed.

12. The display apparatus of claim 11, wherein a corresponding one of the resistance units is between both ends of each of the first lines, which are discontinuous, and
   wherein each of the resistance units comprises a resistance member and a connection member that electrically connects both ends of a corresponding one of the first lines.

13. The display apparatus of claim 12, wherein the resistance member comprises a doped semiconductor material, and is below the first insulating layer.

14. The display apparatus of claim 12, wherein the resistance member comprises the same material as that of the second gate line, and is in the same layer as the second gate line.

15. The display apparatus of claim 14, wherein a corresponding one of the resistance members are in a corresponding one of the upper lines from among the first lines.

16. The display apparatus of claim 12, wherein the resistance member comprises the same material as that of the first gate line and is in the same layer as the first gate line.

17. The display apparatus of claim 16, wherein a corresponding one of the resistance members is in a corresponding one of the resistance units of each of the lower lines of each of the first lines.

18. The display apparatus of claim 12, wherein the connection member comprises a low-resistance metal, and connects the first lines and the resistance member via contact holes.

19. The display apparatus of claim 18, wherein the resistance member comprises a transparent conductive oxide, and is on a protection layer formed on the connection member.

20. The display apparatus of claim 11, wherein the first fan out unit and the second fan out unit have substantially equal resistance or have a linear resistance variation as compared to each other.

21. The display apparatus of claim 11, wherein a driver integrated circuit (IC) for outputting signals is in the pad unit, and the first lines and the second lines are configured to transmit signals from the driver integrated circuit (IC) to the display area.

22. The display apparatus of claim 21, wherein the first lines and the second lines are configured to transmit the signals from the driver integrated circuit (IC) to the data line.

* * * * *